United States Patent [19]

Tsuchiya et al.

[11] Patent Number: 5,198,688
[45] Date of Patent: Mar. 30, 1993

[54] SEMICONDUCTOR DEVICE PROVIDED WITH A CONDUCTIVITY MODULATION MISFET

[75] Inventors: Kazuhiro Tsuchiya; Yutaka Yoshida, both of Kanagawa, Japan

[73] Assignee: Fuji Electric Co., Ltd., Kanagawa, Japan

[21] Appl. No.: 921,393

[22] Filed: Jul. 30, 1992

Related U.S. Application Data

[63] Continuation of Ser. No. 682,406, Apr. 8, 1991, abandoned, which is a continuation of Ser. No. 482,051, Feb. 20, 1990, abandoned.

[30] Foreign Application Priority Data

Mar. 6, 1989 [JP] Japan .................... 1-53276

[51] Int. Cl.$^5$ .................... H01L 29/78; H01L 27/02; H01L 29/04
[52] U.S. Cl. .................... 257/144; 257/212; 257/380
[58] Field of Search .................... 357/23.4, 34

[56] References Cited

U.S. PATENT DOCUMENTS

| | | | |
|---|---|---|---|
| 4,364,073 | 12/1982 | Becke et al. | 357/23.4 |
| 4,646,117 | 2/1987 | Temple | 357/23.4 |
| 4,879,582 | 11/1989 | Kimura et al. | 357/23.12 |
| 4,881,120 | 11/1989 | Nakagawa et al. | 357/23.4 |
| 4,888,627 | 12/1989 | Pattanayak | 357/23.4 |
| 4,901,127 | 2/1990 | Chow et al. | 357/23.4 |
| 4,920,388 | 4/1990 | Blanchard | 357/23.4 |
| 4,949,142 | 8/1990 | Contiero | 357/23.4 |
| 5,060,032 | 10/1991 | Ogawa | 357/23.4 |

OTHER PUBLICATIONS

Muller, Device Electronics for IC's, p. 442, 1986.
Streetman, Solid State Electronic Devices, pp. 330–332.

*Primary Examiner*—Andrew J. James
*Assistant Examiner*—Stephen D. Meier
*Attorney, Agent, or Firm*—Finnegan, Henderson, Farabow, Garrett and Dunner

[57] ABSTRACT

A semiconductive device of the type including a conductivity-modulated field-effect transistor provides all of the three electrodes on the principal surface by use of a buried layer and a variety of means for restricting device current to flow through the buried layer. Some of the arrangements not only overcome some effects of parasitic transistors that are formed, but obtain faster turn-on and turn-off while retaining the desired current capacity of the device. The arrangements include means for stopping the lateral spread of a depletion region, a minority carrier suppression region, and drain wall arrangements, among others.

4 Claims, 4 Drawing Sheets

SEMICONDUCTOR DEVICE PROVIDED WITH A CONDUCTIVITY MODULATION MISFET

This application is a continuation of Ser. No. 07/682,406, filed Apr. 8, 1991, now abandoned; which is a continuation of Ser. No. 07/482,051, filed Feb. 20, 1990, now abandoned.

BACKGROUND OF THE INVENTION

1. Field of the Invention

The present invention relates to a semiconductor device provided with a conductivity modulation type MISFET, in which all the electrodes are formed on one surface thereof.

2. Description of the Related Art

A conventional semiconductor device provided with a conductivity modulation type MISFET (IGBT) comprises, as shown in FIG. 8, an $n^+$-type buffer layer 2 and an $n^+$-type conductivity modulation layer 3 as a drain layer respectively sequentially stacked on a $p^+$-type minority carrier injection layer 1, a $p^+$-type base region 6 and an $n^+$-type source region 7 respectively diffused and formed by self-alignment in the surface side of the conductivity modulating layer 3 by use of a polysilicon gate 5 oxide film 4 as a mask, a gate electrode 8 connected onto the polysilicon gate 5, a $p^+$-type contact region 9 of the $p^+$-type base region 6, a source electrode 10 connected with the $n^+$-type source region 7, and a drain electrode 11 provided as a coat over the minority carrier injection layer 1 in the back side.

Through an inversion layer formed in the surface of the $p^+$-type base 6, electrons (majority carriers) flow through the conductivity modulating layer 3 in the vertical direction as illustrated by the solid line arrow, and at the same time positive holes (minority carriers) are injected into the conductivity modulating layer 3 as illustrated by the dotted line arrow. Consequently, a conductivity modulating condition is induced, in turn lowering resistance in the conductivity modulating layer 3. It is therefore possible to obtain a large current capacity.

Although there is no problem in a single such element, there are the following problems in a semiconductor device in which a plurality of IGBT elements or other elements are formed on one and the same semiconductor substrate.

That is, for a conventional IGBT element having a gate electrode 8 and a source electrode 10 in its surface side and a drain electrode 11 provided as a coating on its back side, it is necessary to provide a technique of isolation between elements such as isolation of pn junctions and so on, both on the back side as well as on the principal surface, so that there is a serious problem in technique as well as in cost. Moreover, even if this problem could be solved, wiring between respective elements would extend between the opposite surfaces, so that it would be difficult to carry out the wiring.

SUMMARY OF THE INVENTION

It is therefore an object of the present invention to provide a semiconductor device including a conductivity modulation type field-effect transistor, in which a conductivity modulating layer is formed on a buried layer and a minority carrier injection region is provided in the principal surface of this conductivity modulating layer, so that three electrodes are formed on the same surface without losing the property of obtaining a large current capacity.

In accordance with the present invention, in a first embodiment, the semiconductor device including a conductivity modulation type field-effect transistor comprises: a first conductivity type buried layer; an source and gate portion including second and first conductivity type regions formed by double diffusion in the principal surface of a first conductivity type conductivity modulating layer on the buried layer; and a second conductivity type minority carrier injection portion formed in an isolation region isolated from the source and gate portion in the principal surface of the conductivity modulating layer. For example, there is a case where means for stopping a first conductivity type depletion layer is formed between the source and gate portion and the minority carrier injection portion in the principal surface of the conductivity modulating layer, and a case where a first conductivity type minority carrier injection suppressing region is formed so as to tend to surround the minority carrier injection portion.

In a second embodiment according to the present invention, the semiconductor device provided with a conductivity modulation type field-effect transistor further comprises, in addition to the elements of the first embodiment, a first conductivity type majority carrier extraction portion formed in the principal surface of the conductivity modulating layer, and a resistance film connecting the minority carrier injection portion with the majority carrier extraction portion. In such a second embodiment, there is a case where the majority carrier extraction portion is formed between the minority carrier injection portion and the source and gate portion and a first conductivity type wall region is formed so as to surround only the majority carrier extraction portion, and a case where the minority carrier injection and majority carrier extraction portions are formed in a first conductivity type wall region.

Advantageously, in the embodiments of the invention, since electrodes to be connected with the minority carrier injection portion are provided at the lead-out side of a gate electrode, it is possible to obtain a semiconductor device of the conductivity modulation type in which all the electrodes are provided on one surface. Majority carriers flow from the source and gate portion through the conductivity modulating layer into the buried layer in the vertical direction, flow through the buried layer in the lateral direction, and then go toward the minority carrier injection portion through the conductivity modulating layer. Then, at the same time, minority carriers are injected from the minority carrier injection portion into the conductivity modulating layer so as to induce a conductivity modulating condition, so that it is possible to obtain a large current capacity. If the isolation distance between the source and gate portion and the minority carrier injection portion is shortened in order to reduce the element occupying area, the dielectric strength is lowered. If a depletion layer end stopper is formed, however, lateral growth of a depletion layer is prevented, so that it is possible to obtain dielectric strength almost as high as that of a conventional IGBT. Moreover, if a first conductivity type minority carrier injection suppressing region is formed so as to surround the minority carrier injection portion, it is possible to shorten the turn-off time as well as to ensure high dielectric strength, as in the case of the depletion layer end stopper.

Next according to the second embodiment, prior to the injection of minority carriers into the conductivity modulating region during a turn-on period, because of a parasitic transistor constituted by the second conductivity type minority carrier injection region, the first conductivity type conductivity modulating region and the second conductivity type region, the majority carriers injected from the source and gate portion flow to the majority carrier extraction portion through a resistance film, so that increase of voltage drop of the resistance film brings a sudden on-state on the above-mentioned parasitic transistor. As a result, a conductivity modulating condition occurs earlier. In the case where the majority carrier extraction portion is formed between the minority carrier injection portion and the source and gate portion and a first conductivity type wall region is formed so as to surround only the majority carrier extraction portion, it is possible to realize a small element occupying area and high dielectric strength. Further, in the case where the minority carrier injection portion and the majority carrier extraction portion are formed in the first conductivity type wall region, high dielectric strength is obtained, and the first conductivity type wall functions as a minority carrier injection suppressing region, so that it is possible to shorten the turn-off time or prevent latching up.

BRIEF DESCRIPTION OF THE DRAWINGS

Further features and advantages of the present invention will become apparent from the following detailed description, taken together with the drawing, in which.

DESCRIPTION OF THE PREFERRED EMBODIMENT

Figure 1:
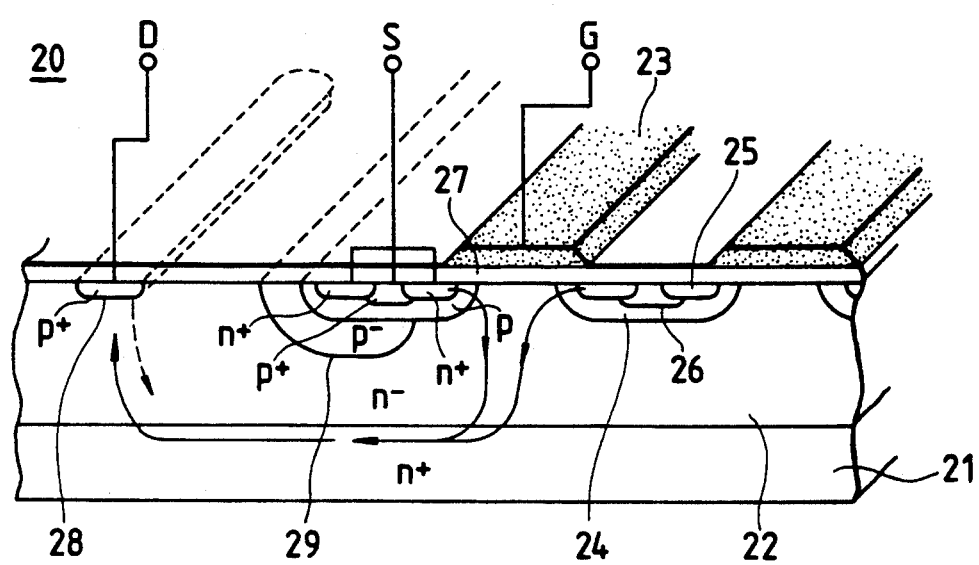
FIG. 1 is a perspective view with a vertical cross-section illustrating the structure of a first embodiment of the conductivity modulating device according to the present invention.

In the embodiment of FIG. 1, a semiconductor device 20 includes an n⁻ type conductivity modulating layer 22 as a drain layer formed by epitaxial growth on a buried layer 21 having high impurity concentration, and a p-type base region 24 and an n⁺-type source region 25 formed by double diffusion in the surface side of the conductivity modulating layer 22 by use of a strip-shaped polysilicon gate 23 as a mask. A gate electrode G is connected with the polysilicon gate 23 as a mask. A gate electrode G is connected with the polysilicon gate 23, a gate oxide film 27 being disposed directly under the polysilicon gate 23, on the surface side of the conductivity modulating layer 22. The n-type impurity of the conductivity modulating layer 22 in this embodiment is phosphorous, and its impurity concentration is $10^6$ atm/cm$^3$. The impurity concentration of the n⁺-type source region 25 is $10^{20}$ atm/cm$^3$, e.g., of phosphorous. The p-type impurity of the p-type base region 24 is boron, and its impurity concentration is about $10^{15}$ atm/cm$^3$.

A p⁺-type minority carrier injection region 28 is formed by diffusion in a region isolated from the MOS portion in the surface side of the conductivity modulating layer 22. This minority carrier injection region 28 is provided in a stripe shape almost in parallel with the stripe-shaped polysilicon gate 23, and connected with a drain electrode D. A graft base 29 facing the minority carrier injection region 28 is formed around the p-type base region 24 adjacent to the minority carrier injection region 28. This graft base 29 is to relieve the concentration of depletion electric field.

Figure 7A:
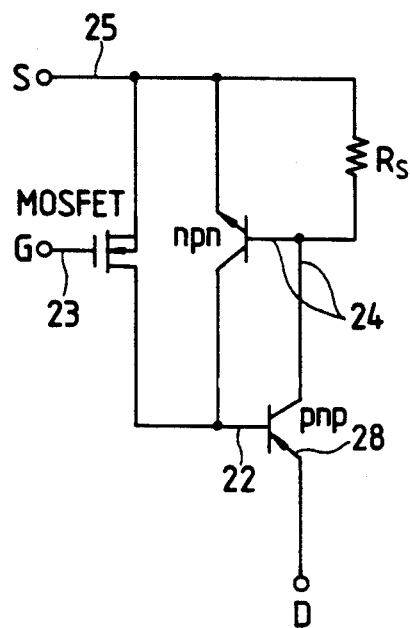
FIG. 7(A) is an equivalent circuit of the embodiments in FIGS. 1 to 3.

The equivalent circuit of this embodiment, as shown in FIG. 7(A), is substantially the same as the conventional IGBT, and a MOSFET is constituted by an inversion layer directly under the polysilicon gate 23, the source region 25 and the conductivity modulating layer 22, and an emitter, a base and a collector of a parasitic pnp transistor are formed by the minority carrier injection region 28, the conductivity modulating layer 22 and the p-type base region respectively. And an emitter, a base and a collector of a parasitic npn transistor are formed by the source region 25, the p-type base region 24 and the conductivity modulating layer 22 respectively, and a short circuit resistor Rs is parasitic between the p-type base region 24 and the source region 25.

Through the inversion layer formed directly under the gate 23 of the p-type base region 24, electrons flow into the conductivity modulating layer 22 as illustrated by the arrow of solid lines in FIG. 1, and go towards the minority carrier injection region 28 mainly through the buried layer 21. On the other hand, positive holes are injected from the minority carrier injection region 28 into the conductivity modulating layer 22 as illustrated by the arrow shown as a dotted line in FIG. 1, so that a conductivity modulating condition is induced. Therefore, in the same manner as a conventional vertical conductivity modulation type MOSFET, not only a large current capacity can be obtained but isolation between elements and wiring between electrodes can be simplified because the drain electrode D can be disposed on the same surface as the gate electrode G and the source electrode S. Accordingly, the realization of integrated circuits including conductivity modulating MOSFET elements is promoted.

Figure 2:
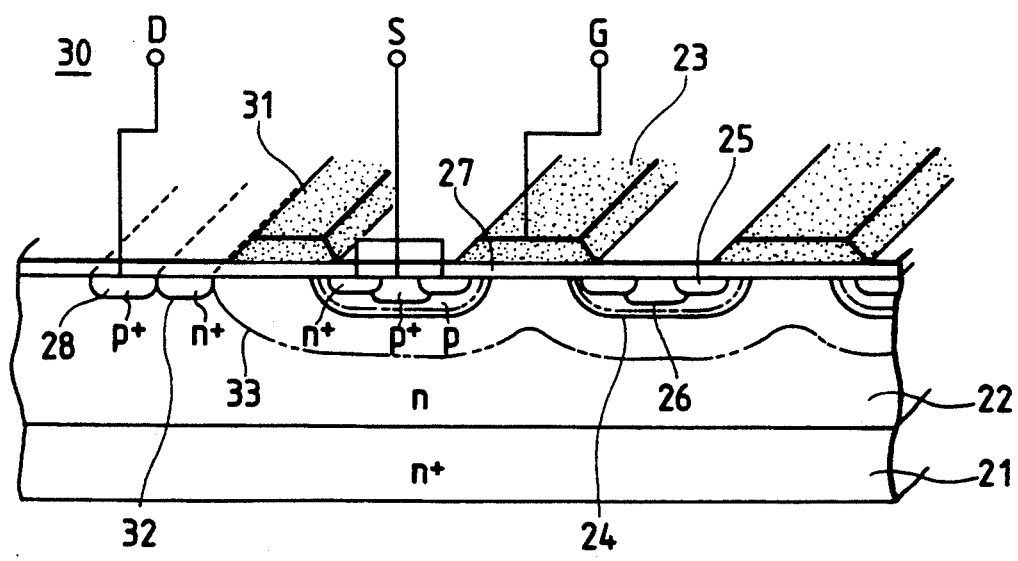
FIG. 2 is a perspective view with a vertical cross-section illustrating the structure of a second embodiment of the conductivity modulating device according to the present invention.

In a second embodiment of the conductivity modulating MOSFET according to the present invention, as shown in FIG. 2, the same parts as those in FIG. 1 are referenced correspondingly and will not be described.

A semiconductor device 30 of this embodiment is different from the semiconductor device 20 of the first embodiment in that the semiconductor device 30 is provided with a lateral MOS structure in which a polysilicon gate 31 forming a lateral current path is additionally provided, and in order to suppress decrease of dielectric strength against increase of current capacity, an n+-type depletion layer end stopper 32 is formed by diffusion between the polysilicon gate 31 and the minority carrier injection region 28 functioning as a field plate in the surface side of the conductivity modulating layer 22.

If the electric potential of the drain electrode D is increased while the gate electrode G and the source electrode S are kept in the same electric potential, a depletion layer end 33 grows toward the minority carrier injection region 28 to connect with the latter so as to cause punch through. Particularly, the punch through is apt to be caused in the case of provision of a lateral DMOS structure, but if the depletion layer end stopper 32 is provided, it is possible to expect to make a large current capacity in comparison with that in the first embodiment while suppressing deterioration of dielectric strength. The equivalent circuit of this embodiment is substantially the same as that shown in FIG. 7(A).

Figure 3:
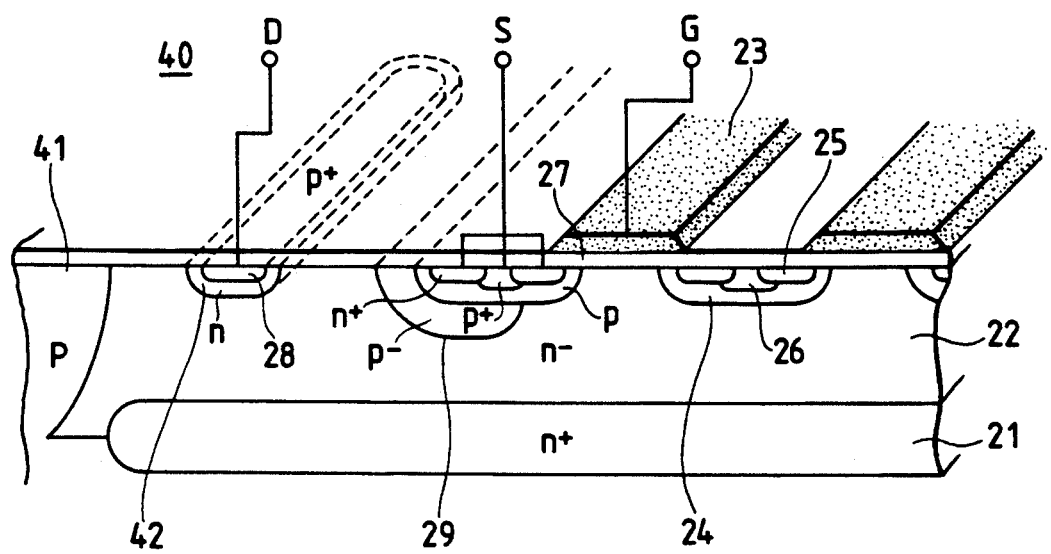
FIG. 3 is a perspective view with a vertical cross-section illustrating the structure of a third embodiment of the conductivity modulating device according to the present invention.

In a third embodiment of the conductivity modulating MOSFET according to the present invention, as shown in FIG. 3, the same parts as those in FIG. 1 are referenced correspondingly and will not be described.

A semiconductor device 40 of this embodiment is different from the semiconductor device 20 of the first embodiment in that in the semiconductor device 40, an MOS portion and a minority carrier injection region 28 are made up inside a conductivity modulating layer 22 defined by a p-type isolation region 41, and an n-type minority carrier suppressing region 42 having n-type impurity of phosphorous the concentration of which is about not less than $10^{17}$ atm/cm$^3$ is formed around the minority carrier injection region 28.

In the case where the concentration of the conductivity modulating layer 22 is comparatively low to be, for example, about $10^{15}$ atm/cm$^3$, it is easy to induce latch up. In the case of using pn junction isolation as isolation between elements, a parasitic pnp transistor constituted by the minority carrier injection region 28, the conductivity modulating layer 22 and the p-type isolation region 41 operates so as to generate power loss, but the n-type minority carrier injection suppressing region 42 surrounding the minority carrier injection region 28 is formed so as to contribute to the prevention of latch up and the suppression of the parasitic pnp transistor as well as the suppression of deterioration of dielectric strength. Moreover, the minority carrier injection suppressing region 42 naturally shortens turn-off time as a buffer region. Then, a current amplification factor hf$_e$ of the parasitic transistor was not larger than 0.01.

Figure 4:
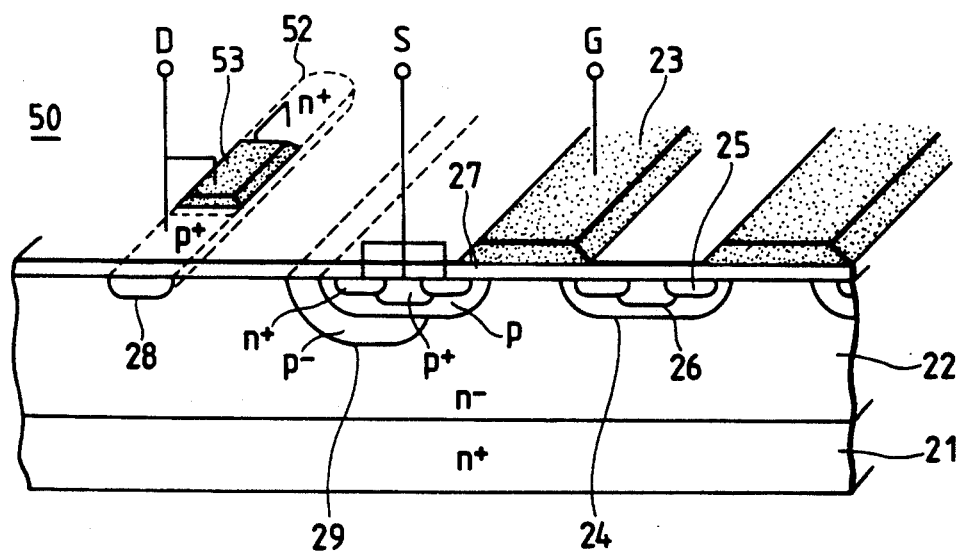
FIG. 4 is a similar view illustrating a fourth embodiment of the conductivity modulating device according to the present invention.

In a fourth embodiment of the conductivity modulating MOSFET according to the present invention, as shown in FIG. 4, the same parts as those in FIG. 1 are referenced correspondingly and will not be described.

In a semiconductor device 50 in this embodiment, a p-type minority carrier injection region 28 is formed in a region isolated from an MOS portion in the surface side of a conductivity modulating layer 22, and in a region adjacent thereto, an n+-type majority carrier extraction region 52 is formed. Further, a polysilicon resistance film 53 is connected between a drain electrode D connected with the minority carrier injection region 28 and the majority carrier extraction region 52.

Figure 7B:
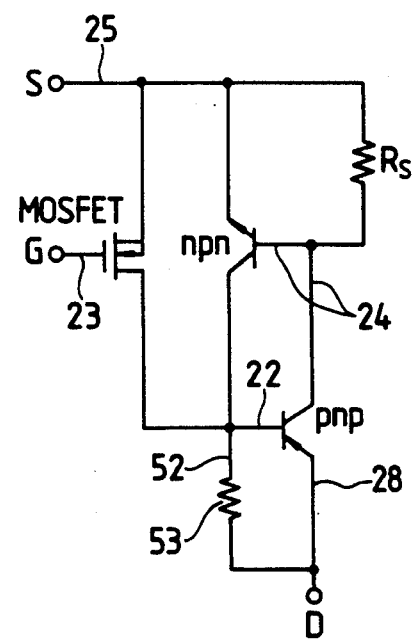
FIG. 7(B) is an equivalent circuit of the embodiments in FIGS. 4 to 6.
Figure 8:
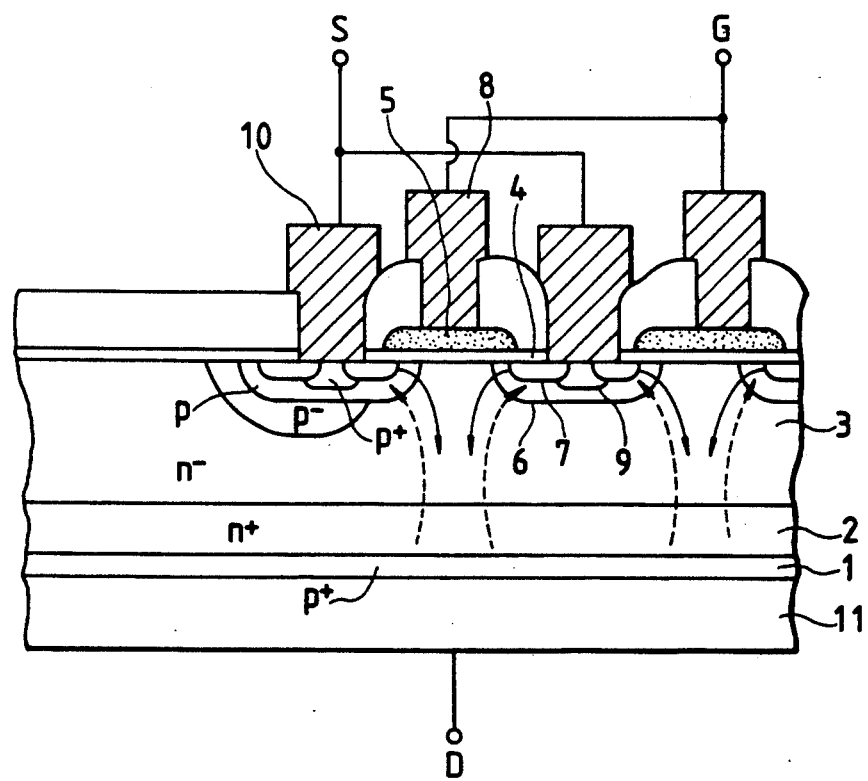
FIG. 8 is a perspective view with a vertical cross-section illustrating a conventional conductivity modulating semiconductive device including a field-effect transistor.

The equivalent circuit of this embodiment is illustrated in FIG. 7(B) which is configured such that a resistance film 53 is additionally provided between the minority carrier injection region 28 and the majority carrier extraction region 52 in the equivalent circuit (corresponding to the first to third embodiments) of FIG. 7(A). The addition of the resistance film 53 means that a parasitic pnp transistor is brought into an on-state, that is, its current amplification factor hf$_e$ is made low, early. When the MOSFET is in an on-state so that the voltage between a source electrode S and a drain electrode D is low, though the parasitic pnp transistor is in an off-state, electrons (majority carriers) flow from the majority carrier extraction region 52 into the drain electrode D through the resistance film 53, so that the parasitic pnp transistor is turned into an on-state early by the increase of voltage drop of the resistance film 53, and therefore positive holes (minority carriers) are injected into the conductivity modulating layer 22 quickly. Moreover, this resistance film 53 has an effect to prevent latch up. Although it has been impossible to add a resistance film in a conventional vertical-type conductivity modulating MOSFET because of its vertical stacking structure, a single-surface version according to our invention, which we term "lateral-type" conductivity modulating MOSFET as shown in this embodiment brings an advantage that the resistance film 53 can be provided as a coating on the principal device surface.

Figure 5:
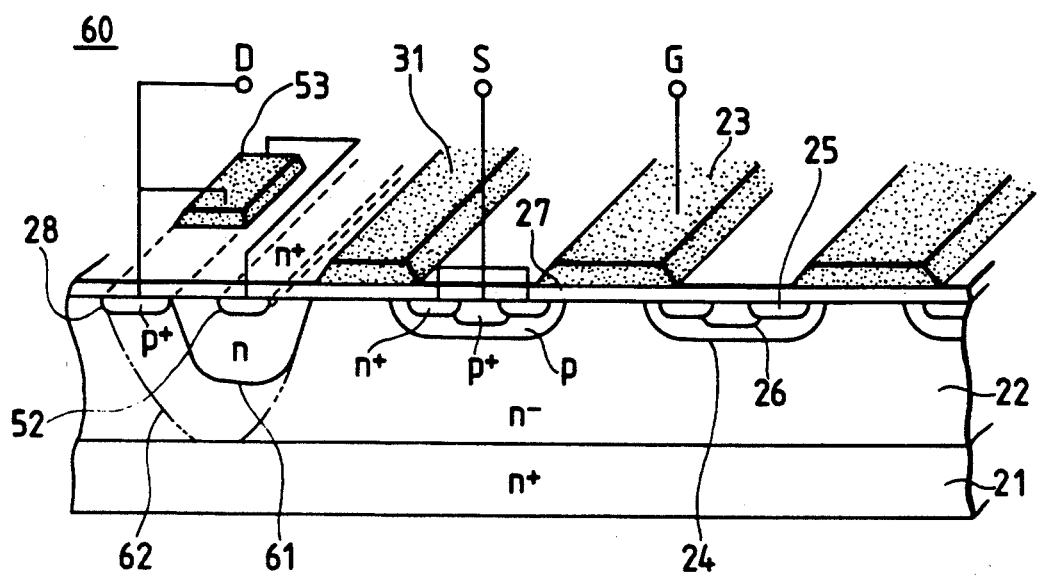
FIG. 5 is another similar view illustrating a fifth embodiment of the conductivity modulating device according to the present invention.

FIG. 5 is a structure vertical section illustrating a fifth embodiment of the conductivity modulating MOSFET according to the present invention. In FIG. 5, the same parts as those in FIG. 4 are referenced correspondingly and will not be described.

A semiconductor device 60 of this embodiment has a lateral MOS structure in which a polysilicon gate 31 forming a lateral current path is additionally provided. Therefore, in order to suppress the deterioration of dielectric strength in the same manner as the second embodiment, a majority carrier extraction region 52 is formed in a stripe shape between the polysilicon gate 31 and a minority carrier injection region 28. A drain wall 61 is producable thereby, smaller in size than a usual drain wall 62 illustrated by the two-dotted chain line; that is, though the mask width of the usual drain wall 62 is about 12 μm, the mask width of the formed shallow drawing wall 61 is 3 μm, and the rest width 9 μm, for example, the minority carrier injection region 28 having its mask width of 7 μm is formed. By the shallow drain wall 61, not only is it possible to suppress the expansion of an element occupying area, but it is possible to suppress punch through between a p-type base region 24 and the minority carrier injection region 28 and therefore to prevent the deterioration of dielectric strength because of the function of the shallow drain wall 61 as a depletion layer end stopper.

Figure 6:
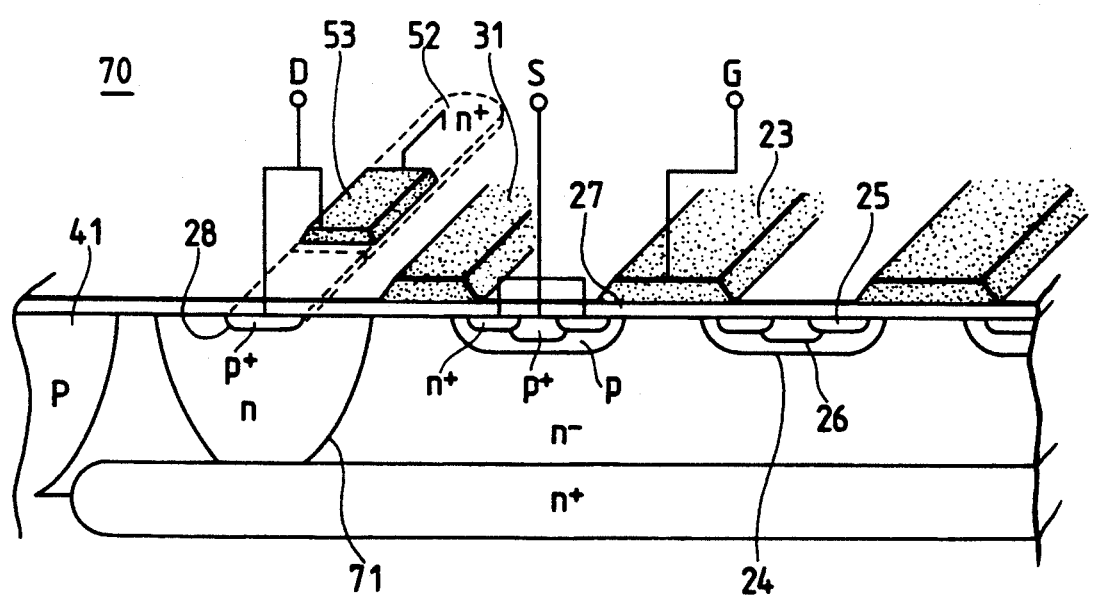
FIG. 6 is still another similar view illustrating a sixth embodiment of the conductivity modulating device according to the present invention.

FIG. 6 is a structure vertical section illustrating a sixth embodiment of the conductivity modulating MOSFET according to the present invention. In FIG. 6, the same parts as those in FIG. 4 are referenced correspondingly and will not be described.

In a semiconductor device 70 of this embodiment, a p-type isolation region 41 is formed in a region adjacent to a minority carrier injection region 28 so as to perform the isolation between elements. The minority carrier injection region 28 and a majority carrier extraction region 52 are formed in an n-type drain wall 71. In this embodiment, in the same manner as in the third embodiment, a parasitic pnp transistor constituted by the minority carrier injection region 28, a conductivity modulating layer 22 and the p-type isolation region 41 is suppressed so as to reduce power loss. Moreover, the drain wall 71 as a depletion layer end stopper suppresses the deterioration of dielectric strength. Further, the drain wall 71 has a function to prevent latch up.

As has been described above, since the present invention is characterized in that a minority carrier injection portion is provided in a principal surface isolation region isolated from an MIS portion formed in the principal surface of a conductivity modulating layer on a buried layer, the present invention has the following effects.

It is possible to dispose on the same surface not only a gate electrode and a source electrode but also a drain electrode, so that it is possible to supply isolation and wiring between elements in an integrated circuit including conductivity-modulated field-effect transistor; and it is therefore possible to realize such a semiconductor device. Moreover, it is possible to obtain a large current capacity in the same manner as that in a conventional vertical-type MISFET.

If a depletion layer end stopper is provided between the above-mentioned source and gate portion and the above-mentioned minority carrier injection portion, it is possible to obtain high dielectric strength. Particularly, there is an advantage in the case of having a lateral MIS structure.

If the above-mentioned minority carrier injection portion is surrounded by a minority carrier injection suppressing region, since it is possible to suppress a parasitic transistor formed in the case that adjacent pn junction isolations are incomplete, it is possible to suppress the deterioration of dielectric strength and to prevent latch up as well as to reduce power loss. Moreover, it is possible to reduce element occupation area.

If a majority carrier extraction portion and a resistance film connecting the above-mentioned minority carrier injection portion with the majority carrier extraction portion are provided in addition to the above-mentioned source and gate portion and the minority carrier injection portion, not only it is possible that all of three electrode are mounted on the same surface, but also since injecting minority carriers can be started earlier, it is possible to take current density into a low on-voltage region in comparison with a conventional conductivity modulation type MOSFET.

If the above-mentioned majority carrier extraction portion is formed between the minority carrier injection portion and the MIS portion and a wall region is formed so as to surround only a majority carrier extraction portion, it is possible to obtain high dielectric strength. Moreover, it is possible to suppress the expansion of an element occupation area.

If the above-mentioned minority carrier injection portion and the above-mentioned majority carrier extraction portion are formed in a wall region, it is possible to suppress a parasitic transistor formed in the case where pn junction isolations are adjacent so that it is possible to expect to suppress the deterioration of dielectric strength and to prevent latch up as well as to reduce power loss.

What is claimed is:

1. A lateral MOSFET semiconductor device, comprising:
   a semiconductor substrate including a conductivity modulating layer of first conductivity type having a predetermined impurity concentration and including under the conductivity modulating layer a buried layer of first conductivity type having an impurity concentration higher than the predetermined impurity concentration, wherein a surface of the conductivity modulating layer comprises a principal surface of the semiconductor substrate;
   a second conductivity type minority carrier injection region formed in the principal surface;
   a first conductivity type majority carrier extraction region formed in the principle surface adjacent to the minority carrier injection region;
   resistive means formed on the principal surface for ohmically bridging the second conductivity type minority carrier injection region and the first conductivity type majority carrier extraction region;
   a source disposed on the principal surface;
   a gate disposed on the principal surface; and,
   a drain disposed on the principal surface, wherein the drain is connected to the resistive means and the second conductivity type minority carrier injection region.

2. A semiconductor device including a conductivity modulated MOSFET, comprising:
   a first conductivity type buried layer;
   a first conductivity type modulating layer formed on top of the buried layer;
   a second conductivity type first base region formed with a predetermined depth in the surface of the modulating layer;
   a second conductivity type second base region formed with a depth less than the predetermined depth in the surface of the modulating layer, and overlapping a portion of the first base region;
   first conductivity type source regions selectively formed in the second base region;
   a second conductivity type minority carrier injection region formed in the surface of the modulating layer and disposed with respect to the second base region such that exposed portion of the first base region is interposed between the second base region and the minority carrier injection region;
   a first conductivity type majority carrier extraction region formed in the surface of the modulating layer adjacent to the minority carrier injection region;
   an oxide film formed on the surface of the modulating layer;
   a gate electrode formed on the oxide film;
   a source electrode connected through the oxide film to the source and base regions;
   a drain electrode connected through the oxide film to the minority carrier injection region and disposed on the surface of the modulating layer;
   a resistance film formed on the oxide film bridging the minority carrier injection region and the majority carrier extraction region, and connected to the drain electrode and the majority carrier extraction region.

3. A semiconductor device including a conductivity modulated MOSFET, comprising:
   a first conductivity type buried layer;
   a first conductivity type modulating layer formed on top of the buried layer;
   a second conductivity type base region formed in the surface of the modulating layer;
   first conductivity type source regions selectively formed in the base region;
   a second conductivity type minority carrier injection region formed in the surface of the modulating layer;

an oxide film formed on the surface of the modulating layer;

a gate electrode formed on the oxide film;

a source electrode connected through the oxide film to the source and base regions;

a drain electrode connected through the oxide film to the minority carrier injection region and disposed on the surface of the modulating layer;

a lateral current path gate formed on the oxide film and overlapping a portion of the base and source regions;

a first conductivity type drain wall region formed in the surface of the modulating layer between the minority carrier injection region and the lateral current path gate;

a first conductivity type majority carrier extraction region formed in the central portion of the drain wall region and extending parallel to the lateral current path gate;

a resistance film formed on the oxide film adjacent to the minority carrier injection region and connected to the drain electrode and the majority carrier extraction region.

4. A semiconductor device including a conductivity modulated MOSFET, comprising:

a first conductivity type buried layer;

a first conductivity type modulating layer formed on top of the buried layer;

a second conductivity type base region formed in the surface of the modulating layer;

first conductivity type source regions selectively formed in the base region;

a second conductivity type isolation region formed in the surface of the modulating layer;

an oxide film formed on the surface of the modulating layer;

a gate electrode formed on the oxide film;

a source electrode connected through the oxide film to the source and base regions;

a lateral current path gate formed on the oxide film and overlapping a portion of the base and source regions;

a first conductivity type drain wall region formed in the surface of the modulating layer, disposed between the lateral current path gate and the isolation region, such that the depth of the drain wall region extends to the buried layer;

a second conductivity type minority carrier injection region formed in the central portion of the drain wall region;

a drain electrode connected through the oxide film to the minority carrier injection region and disposed on the surface of the modulating layer;

a first conductivity type majority carrier extraction region formed in the central portion of the drain wall region adjacent to the minority carrier injection region;

resistance film formed on the oxide film bridging the minority carrier injection region and the majority carrier extraction region, and ohmically connected to the drain electrode.

* * * * *